(12) United States Patent
Segal et al.

(10) Patent No.: US 7,269,052 B2
(45) Date of Patent: Sep. 11, 2007

(54) DEVICE SELECTION CIRCUITRY CONSTRUCTED WITH NANOTUBE TECHNOLOGY

(75) Inventors: Brent M. Segal, Woburn, MA (US); Darren K. Brock, Woburn, MA (US); Thomas Rueckes, Rockport, MA (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 11/546,130

(22) Filed: Oct. 10, 2006

(65) Prior Publication Data

US 2007/0030721 A1 Feb. 8, 2007

Related U.S. Application Data

(63) Continuation of application No. 10/693,241, filed on Oct. 24, 2003, now Pat. No. 7,120,047, which is a continuation of application No. 09/915,173, filed on Jul. 25, 2001, now Pat. No. 6,643,165.

(51) Int. Cl.
*G11C 11/00* (2006.01)
*G11C 7/00* (2006.01)

(52) U.S. Cl. ................... 365/151; 365/153; 977/DIG. 1
(58) Field of Classification Search ............... 365/151, 365/153, 158; 977/DIG. 1
See application file for complete search history.

(56) References Cited

U.S. PATENT DOCUMENTS

| 4,939,556 | A | * | 7/1990 | Eguchi et al. | 257/25 |
|---|---|---|---|---|---|
| 5,517,194 | A | * | 5/1996 | Carroll et al. | 340/10.34 |
| 5,652,856 | A | * | 7/1997 | Santeler et al. | 711/105 |
| 6,159,620 | A | * | 12/2000 | Heath et al. | 428/615 |

* cited by examiner

*Primary Examiner*—Son Dinh
(74) *Attorney, Agent, or Firm*—Wilmer Cutler Pickering Hale & Dorr LLP

(57) ABSTRACT

A memory system having electromechanical memory cells and decoders is disclosed. A decoder circuit selects at least one of the memory cells of an array of such cells. Each cell in the array is a crossbar junction at least one element of which is a nanotube or a nanotube ribbon. The decoder circuit is constructed of crossbar junctions at least one element of each junction being a nanotube or a nanotube ribbon.

19 Claims, 16 Drawing Sheets

DEVICE SELECTION CIRCUITRY CONSTRUCTED WITH NANOTUBE TECHNOLOGY

CROSS-REFERENCE TO RELATED APPLICATIONS

This application is a continuation of and claims priority under 35 U.S.C. §120 to U.S. patent application Ser. No. 10/693,241, filed Oct. 24, 2003 now U.S. Pat. No. 7,120,047 and entitled "Device Selection Circuitry Constructed with Nanotube Technology," which is a continuation of U.S. patent application Ser. No. 09/915,173, now U.S. Pat. No. 6,643,165, filed Jul. 25, 2001 and entitled "Electromechanical Memory Having Cell Selection Circuitry Constructed With Nanotube Technology," the entire contents of which are incorporated herein by reference, which is related to the following patents, filed Jul. 25, 2001, which are incorporated herein by reference in their entireties:

U.S. Pat. No. 6,574,130, entitled "Hybrid Circuit Having Nanotube Electromechanical Memory"; and U.S. Pat. No. 6,919,592, entitled "Electromechanical Memory Array Using Nanotube Ribbons and Method for Making Same."

BACKGROUND

1. Technical Field

This invention relates in general to nonvolatile memory devices for use as memory storage in an electronic device and in particular to nonvolatile memory arrays that use electromechanical elements as the individual memory cells.

2. Discussion of Related Art

Important characteristics for a memory cell in electronic device are low cost, nonvolatility, high density, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

ROM is relatively low cost but cannot be rewritten. PROM can be electrically programmed but with only a single write cycle. EPROM has read cycles that are fast relative to ROM and PROM read cycles, but has relatively long erase times and reliability only over a few iterative read/write cycles. EEPROM (or "Flash") is inexpensive, and has low power consumption but has long write cycles (ms) and low relative speed in comparison to DRAM or SRAM. Flash also has a finite number of read/write cycles leading to low long-term reliability. ROM, PROM, EPROM and EEPROM are all non-volatile, meaning that if power to the memory is interrupted the memory will retain the information stored in the memory cells.

DRAM stores charge on transistor gates that act as capacitors but must be electrically refreshed every few milliseconds complicating system design by requiring separate circuitry to "refresh" the memory contents before the capacitors discharge. SRAM does not need to be refreshed and is fast relative to DRAM, but has lower density and is more expensive relative to DRAM. Both SRAM and DRAM are volatile, meaning that if power to the memory is interrupted the memory will lose the information stored in the memory cells.

Consequently, existing technologies are either non-volatile but are not randomly accessible and have low density, high cost, and limited ability to allow multiples writes with high reliability of the circuit's function, or they are volatile and complicate system design or have low density. Some emerging technologies have attempted to address these shortcomings.

For example, magnetic RAM (MRAM) or ferromagnetic RAM (FRAM) utilizes the orientation of magnetization or a ferromagnetic region to generate a nonvolatile memory cell. MRAM utilizes a magnetoresisitive memory element involving the anisotropic magnetoresistance or giant magnetoresistance of ferromagnetic materials yielding nonvolatility. Both of these types of memory cells have relatively high resistance and low-density. A different memory cell based upon magnetic tunnel junctions has also been examined but has not led to large-scale commercialized MRAM devices. FRAM uses a circuit architecture similar to DRAM but which uses a thin film ferroelectric capacitor. This capacitor is purported to retain its electrical polarization after an externally applied electric field is removed yielding a nonvolatile memory. FRAM suffers from a large memory cell size, and it is difficult to manufacture as a large-scale integrated component. See U.S. Pat. Nos. 4,853,893; 4,888, 630; 5,198,994

Another technology having non-volatile memory is phase change memory. This technology stores information via a structural phase change in thin-film alloys incorporating elements such as selenium or tellurium. These alloys are purported to remain stable in both crystalline and amorphous states allowing the formation of a bi-stable switch. While the nonvolatility condition is met, this technology appears to suffer from slow operations, difficulty of manufacture and reliability and has not reached a state of commercialization. See U.S. Pat. Nos. 3,448,302; 4,845,533; 4,876,667; 6,044, 008.

Wire crossbar memory (MWCM) has also been proposed. See U.S. Pat. Nos. 6,128,214; 6,159,620; 6,198,655. These memory proposals envision molecules as bi-stable switches. Two wires (either a metal or semiconducting type) have a layer of molecules or molecule compounds sandwiched in between. Chemical assembly and electrochemical oxidation or reduction are used to generate an "on" or "off" state. This form of memory requires highly specialized wire junctions and may not retain non-volatility owing to the inherent instability found in redox processes.

Recently, memory devices have been proposed which use nanoscopic wires, such as single-walled carbon nanotubes, to form crossbar junctions to serve as memory cells. See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul., 2000. Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The NTWCM proposals to date rely on directed growth or chemical self-assembly techniques to grow the individual nanotubes needed for the memory cells. These techniques are now believed to be difficult to employ at commercial scales using modern technology. Moreover, they may contain inherent limitations such as the length of the nanotubes that may be grown reliably using these techniques, and it may difficult to control the statistical variance of geometries of nanotube wires so grown.

SUMMARY

The invention provides a memory system having electromechanical memory cells. A decoder circuit selects at least one of the memory cells of an array of such cells. Each cell in the array is a crossbar junction at least one element of which is a nanotube or a nanotube ribbon. The decoder circuit is constructed of crossbar junctions at least one element of each junction being a nanotube or a nanotube ribbon.

DETAILED DESCRIPTION

Preferred embodiments of the invention provide new electromechanical memory arrays and methods for making same. In particular, electromechanical memory cells are created that operate anaologously to the NTWCM devices disclosed in WO 01/03208, which is hereby incorporated by reference in its entirety. However, unlike the NTWCM devices disclosed in WO 01/03208, preferred embodiments of the invention replace the suspended nanoscopic wires used in the NTWCM devices with new ribbons made from a matted layer of nanotubes or a non-woven fabric of nanotubes. These new devices are referred to herein as nanotube ribbon crossbar memories (NTRCMs). The new nanotube belt structures are believed to be easier to build at the desired levels of integration and scale (in number of devices made) and the geometries are more easily controlled.

Because the new nanotube belt crossbar memory devices operate analogously to NTWCM, the description of their architecture and principles of operation is brief. Reference may be made to WO01/03208 for fuller description and background.

Figure 1:
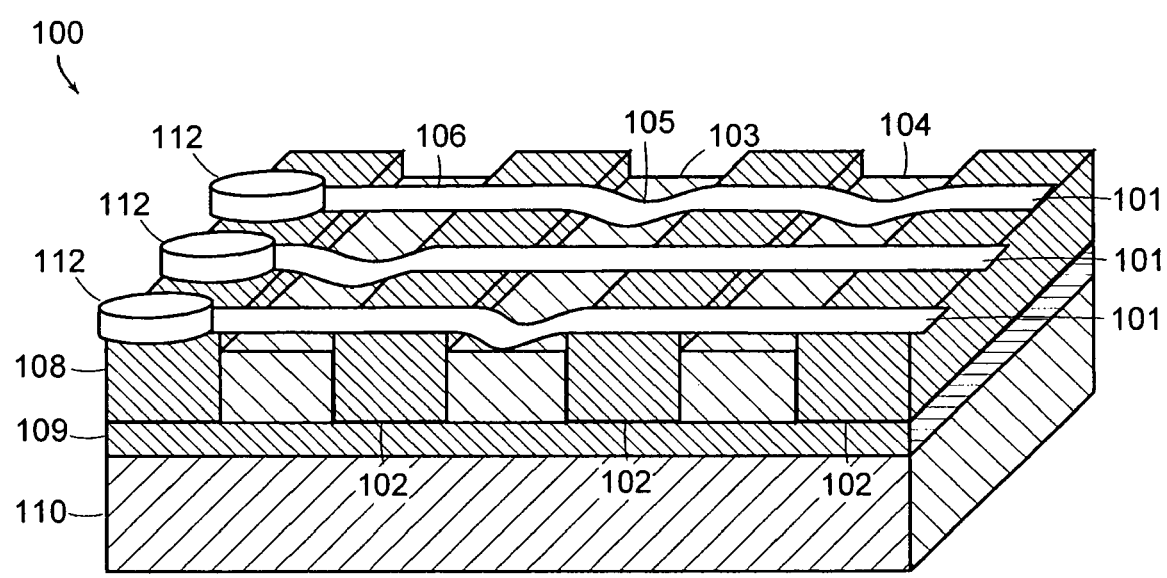
FIG. 1 illustrates a nanotube belt crossbar memory device according to certain embodiments of the invention.

FIG. 1 illustrates an exemplary electromechanical memory array 100 constructed according to principles of preferred embodiments of the invention. The array has a plurality of non volatile memory cells 103 which can be in an "on" state 105 or "off" state 106. The actual number of such cells is immaterial to understanding the invention but the technology may support devices having information storage capacities equivalent to or larger than modem non-volatile circuit devices.

Each memory cell 103 includes a nanotube ribbon 101 suspended by one or more supports 102 over electrical traces or wires, e.g., 104.

Each crossing of a ribbon 101 and a wire, e.g., 104 forms a crossbar junction and defines a memory cell. Under certain embodiments, each cell may be read or written by applying currents and or voltages to electrodes 112 which are in electrical communication with ribbons 101 or through electrodes (not shown) in communication with traces or wires 104. The supports 102 are made from a layer 108 of silicon nitride ($Si_3N_4$). Below layer 108 is a gate oxide layer 109 separating the n-doped silicon traces 104 from an underlying silicon wafer 110.

Figure 2A:
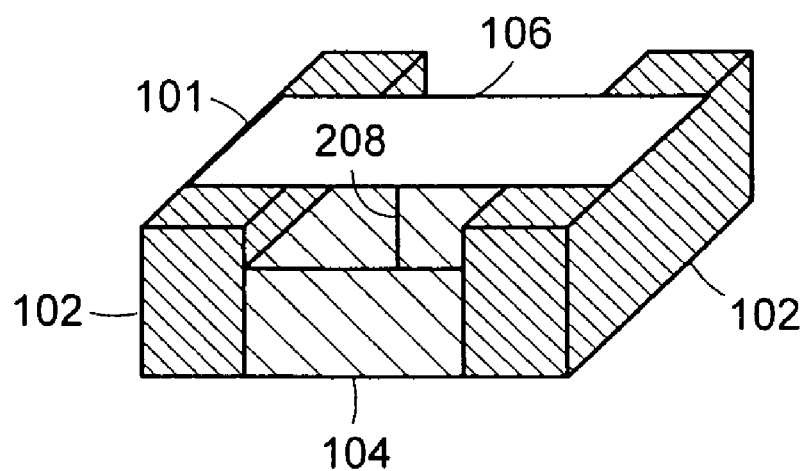
FIG. 2A-B illustrate two states of a memory cell according to certain embodiments of the invention.
Figure 2B:
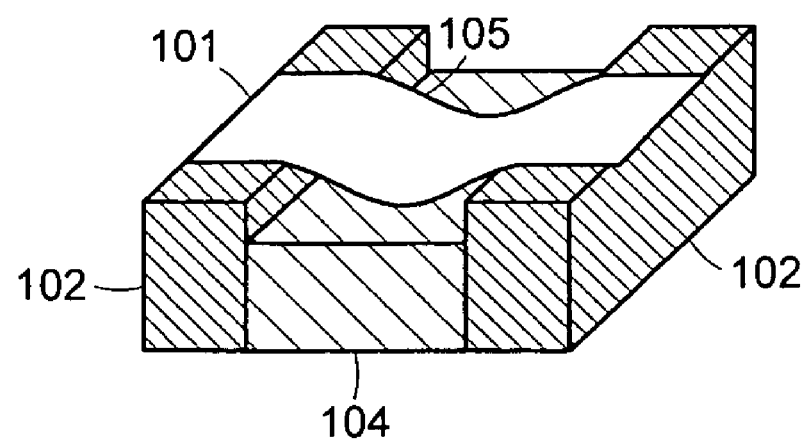

Referring conjointly to FIGS. 1-2B, junction 106 illustrates the cell in a first physical and electrical state in which the nanotube ribbon 101 is separated from corresponding trace 104. Junction 105 illustrates the cell in a second physical and electrical state in which the nanotube ribbon 101 is deflected toward corresponding trace 104. In the first state, the junction is an open circuit, which may be sensed as such on either the ribbon 101 or trace 104 when so addressed. In the second state, the junction is a rectified junction (e.g., Schottky or PN), which may be sensed as such on either the tube 101 or trace 104 when so addressed.

Under certain embodiments, the nanotube ribbon 101 may be held in position at the supports by friction. In other embodiments the ribbon may be held by other means, such as by anchoring the ribbons to the supports using any of a variety of techniques. This friction can be increased through the use of chemical interactions including covalent bonding through the use of carbon compounds such as pyrenes or other chemically reactive species. Evaporated or spin-coated material such as metals, semiconductors or insulators especially silicon, titanium, silicon oxide or polyimide could also be added to increase the pinning strength. The nanotube ribbons or individual nanotubes can also be pinned through the use wafer bonding to the surface. See R. J. Chen et al., "Noncovalent Sidewall Functionalization of Single-Walled Carbon Nanotubes for Protein Immobiliation," J.Am. Chem. Soc., 123, 2001, 3838-39 and Dai et al., Appl. Phys. Lett., 77, 2000, 3015-17 for exemplary techniques for pinning and coating nanotubes by metals. See also WO01/03208 for techniques.

Under certain preferred embodiments as shown in FIGS. 2A-B, a nanotube ribbon 101 has a width of about 180 nm and is pinned to a support 102 preferably fabricated of silicon nitride. The local area of trace 104 under ribbon 101 forms an n-doped silicon electrode and is positioned close to the supports 102 and preferably is no wider than the belt, e.g., 180 nm. The relative separation 208 from the top of the support 102 to the deflected position where the belt 101 attaches to electrode 206 (see FIG. 2B) should be approximately 5-50 nm. The magnitude of the separation 208 is designed to be compatible with electromechanical switching capabilities of the memory device. For this embodiment, the 5-50 nm separation is preferred for certain embodiments utilizing ribbons 101 made from carbon nanotubes, but other separations may be preferable for other materials. This magnitude arises from the interplay between strain energy and adhesion energy of the deflected nanotubes. These feature sizes are suggested in view of modern manufacturing techniques. Other embodiments may be made with much smaller (or larger) sizes to reflect the manufacturing equipment's capabilities.

The nanotube ribbon 101 of certain embodiments is formed from a non-woven fabric of entangled or matted nanotubes (more below). The switching parameters of the ribbon resemble those of individual nanotubes. Thus, the predicted switching times and voltages of the ribbon should approximate the same times and voltages of nanotubes. Unlike the prior art which relies on directed growth or chemical self-assembly of individual nanotubes, preferred embodiments of the present invention utilize fabrication techniques involving thin films and lithography. This method of fabrication lends itself to generation over large surfaces especially wafers of at least six inches. (In contrast, growing individual nanotubes over a distance beyond sub millimeter distances is currently unfeasible.) The ribbons should exhibit improved fault tolerances over individual nanotubes, by providing redundancy of conduction pathways contained with the ribbons. (If an individual nanotube breaks other tubes within the rib provide conductive paths, whereas if a sole nanotube were used the cell would be faulty.) Moreover, the resistances of the ribbons should be significantly lower than that for an individual nanotubes, thus, decreasing its impedance, since the ribbons may be made to have larger cross-sectional areas than individual nanotubes.

Figures 3, 3A:
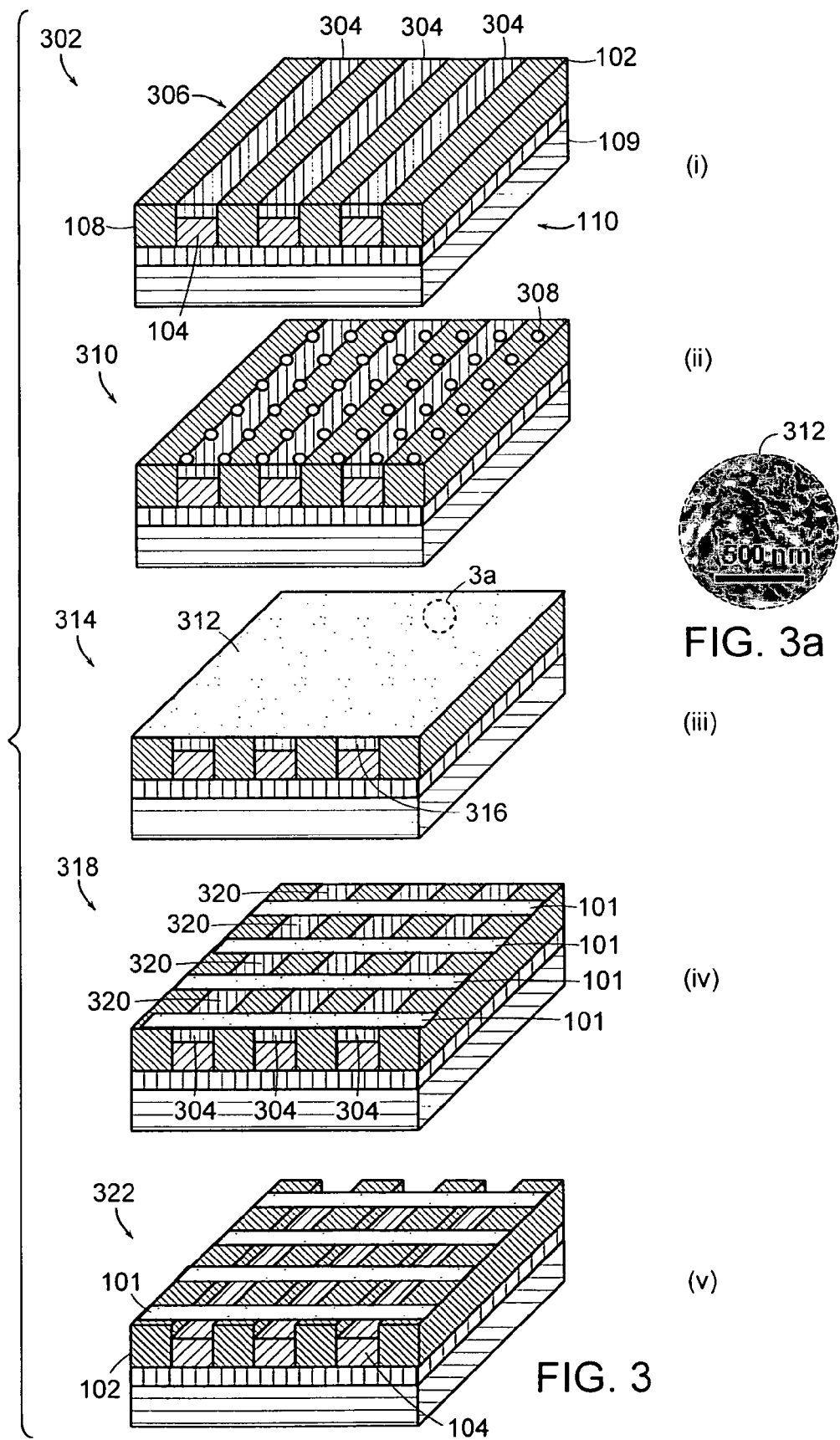
FIGS. 3 and 3A illustrate acts of making memory devices according to certain embodiments of the invention.

FIG. 3 illustrates a method of making certain embodiments of NTRCM devices 100. A first intermediate structure 302 is created or provided. In the illustrated embodiment, the structure 302 includes a silicon substrate 110 having an insulating layer 109 (such as silicon dioxide) and a silicon nitride layer ($Si_3N_4$) 108 that defines a plurality of supports 102. In this instance, the supports 102 are formed by rows of patterned silicon nitride, though many other arrangements are possible, such as a plurality of columns. Conductive traces 104 extend between supports 102. In this instance, the traces 104 are shown as essentially contacting the supports 102, but other arrangements are possible as are other geometries; for example, spaces may exist between trace 104 and support 102 and trace 104 may be fashioned as a wire or may have non-rectangular transverse, cross-sections, including triangular or trapezoidal. Sacrificial layers 304 are disposed above the traces 104 so as to define one planar surface 306 with the upper surface of the supports 102. This planar surface, as will be explained below, facilitates growth of a matted nanotube layer of certain embodiments.

Once such a structure 302 is created or provided, the upper surface 306 receives a catalyst 308. For example, under certain embodiments, a catalyst metal 308, containing iron (Fe), molybdenum (Mo), cobalt or other metals, is applied by spin-coating or other application techniques to create a second intermediate structure 310.

A matted layer 312 of nanotubes is then grown into a non-woven fabric of single-walled carbon nanotubes (SWNTs) to form a third intermediate structure 314. For example, the second intermediate structure 310 may be placed into an oven and heated to a high temperature (for example, about 800-1200° C.) while gases containing a carbon source, hydrogen and inert gas, such as argon or nitrogen, are flowed over the upper surface. This environment facilitates the generation or growth of the matted layer or film 312 of single-walled carbon nanotubes. The layer 312 is primarily one nanotube thick and the various tubes adhere to one another via Van der Waals forces. Occasionally, one nanotube grows over the top of another, though this growth is relatively infrequent due to the growth tendencies of the material. Under some embodiments (not shown), the catalyst 308 may be patterned to assist in growing the nanotubes with specific densities either more or less dense as is desired. When conditions of catalyst composition and density, growth environment, and time are properly controlled, nanotubes can be made to evenly distribute over a given field that is primarily a monolayer of nanotubes. Proper growth requires control of parameters including but not limited to catalyst composition and concentration, functionialization of the underlying surface, spin coating parameters (length and RPM), growth time, temperature and gas concentrations.

A photoresist may then be applied to the layer 312 and patterned to define ribbons in the matted layer of nanotubes 312. The ribbon patterns cross (for example, perpendicularly) the underlying traces 104. The photoresist is removed to leave ribbons 101 of non-woven nanotube fabric lying on planar surface 306 to form fourth intermediate structure 318.

The fourth intermediate structure 318 has portions 320 of its underlying sacrificial layer 304 exposed as shown. The structure 318 is then treated with an acid, such as HF, to remove the sacrificial layer 304, including the portion under the ribbons 101, thus forming an array 322 of ribbons 101 suspended over traces 104 and supported by supports 102.

Subsequent metalization may be used to form addressing electrodes, e.g., 112 shown in FIG. 1.

One aspect of the above technique is that the various growth, patterning, and etching operations may use conventional techniques, such as lithographic patterning. Currently, this may entail feature sizes (e.g., width of ribbon 101) of about 180 nm to as low as 130 nm, but the physical characteristics of the components are amenable to even smaller feature sizes if manufacturing capabilities permit.

Figure 4:
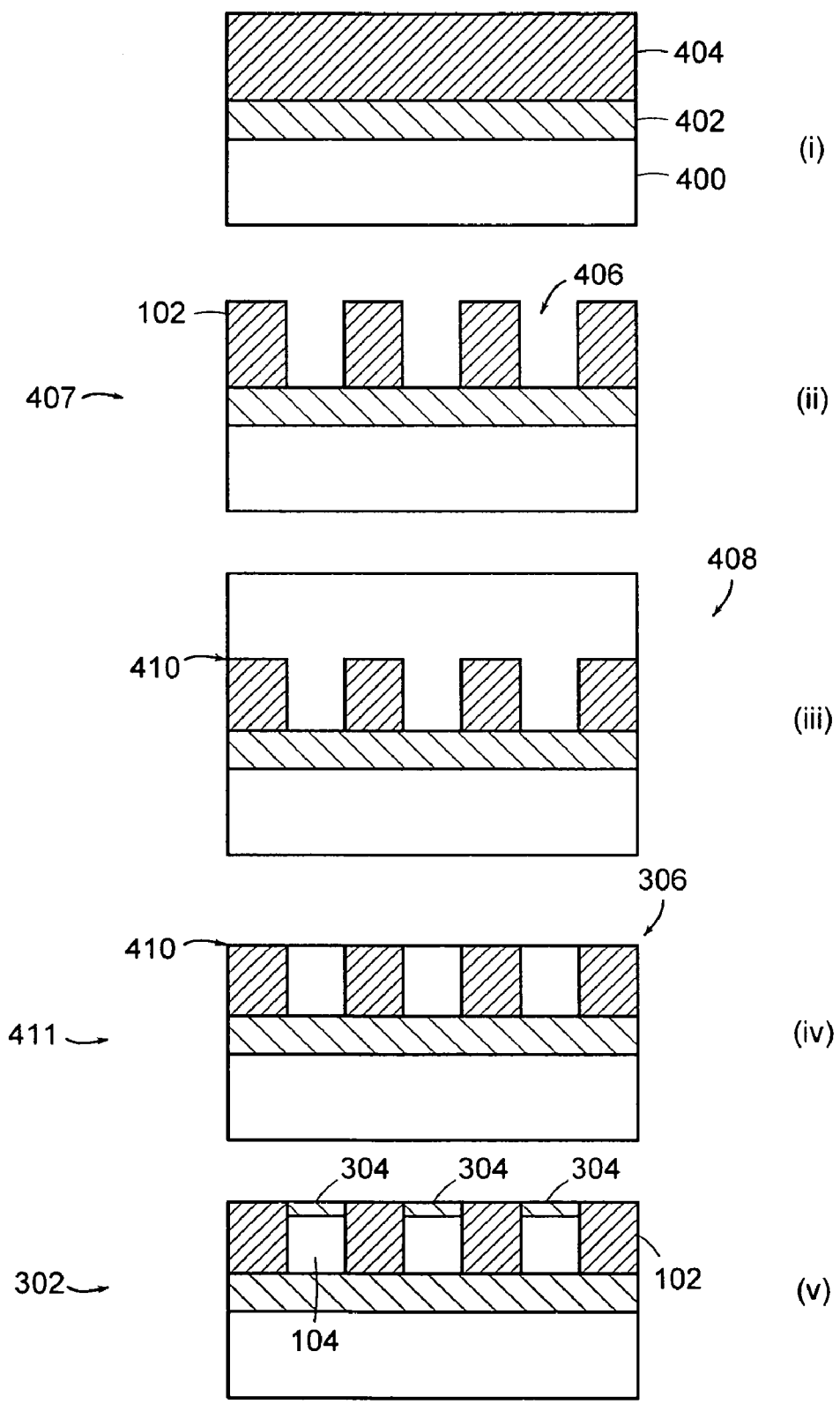
FIG. 4-11 illustrate several forms of creating an intermediate structure used to make memory devices according to certain embodiments of the invention.

As will be explained below, there are many possible ways of creating the intermediate structures or analogous structures described above. FIG. 4, for example, shows one way to create the first intermediate structure 302.

A silicon wafer 400 is provided with an oxide layer 402. The oxide layer is preferably a few nanometers in thickness but could be as much 1 μm. A silicon nitride ($Si_3N_4$) layer 404 is deposited on top of the oxide surface 402. The silicon nitride layer is preferably at least 30 nm thick.

The silicon nitride layer 404 is then patterned and etched to generate cavities 406 to form support structure 407. With modern techniques the cavity width may be about 180 nm wide or perhaps smaller. The remaining silicon nitride material defines the supports 102 (e.g., as row, or perhaps columns).

A covering 408 of n-doped silicon is then deposited to fill the cavities 406. The covering 408 for exemplary embodiments may be about 1 μm thick but may be as thin as 30 nm.

The covering 408 is then processed, for example by self-flattening of thick silicon layers or by annealing, to produce a planar surface 306, discussed above, to form structure 411. In the case of self-flattening, reactive ion-etching (RIE) with end-point detection (EPD) may be utilized until the upper surface 410 of the etched silicon nitride is reached.

The structure 411 is then oxidized to form and define sacrificial layers 304 of $SiO_2$ about 10-20 nm deep into planar surface 306.

The unconverted, remaining portions of silicon form traces 104.

Figure 5:
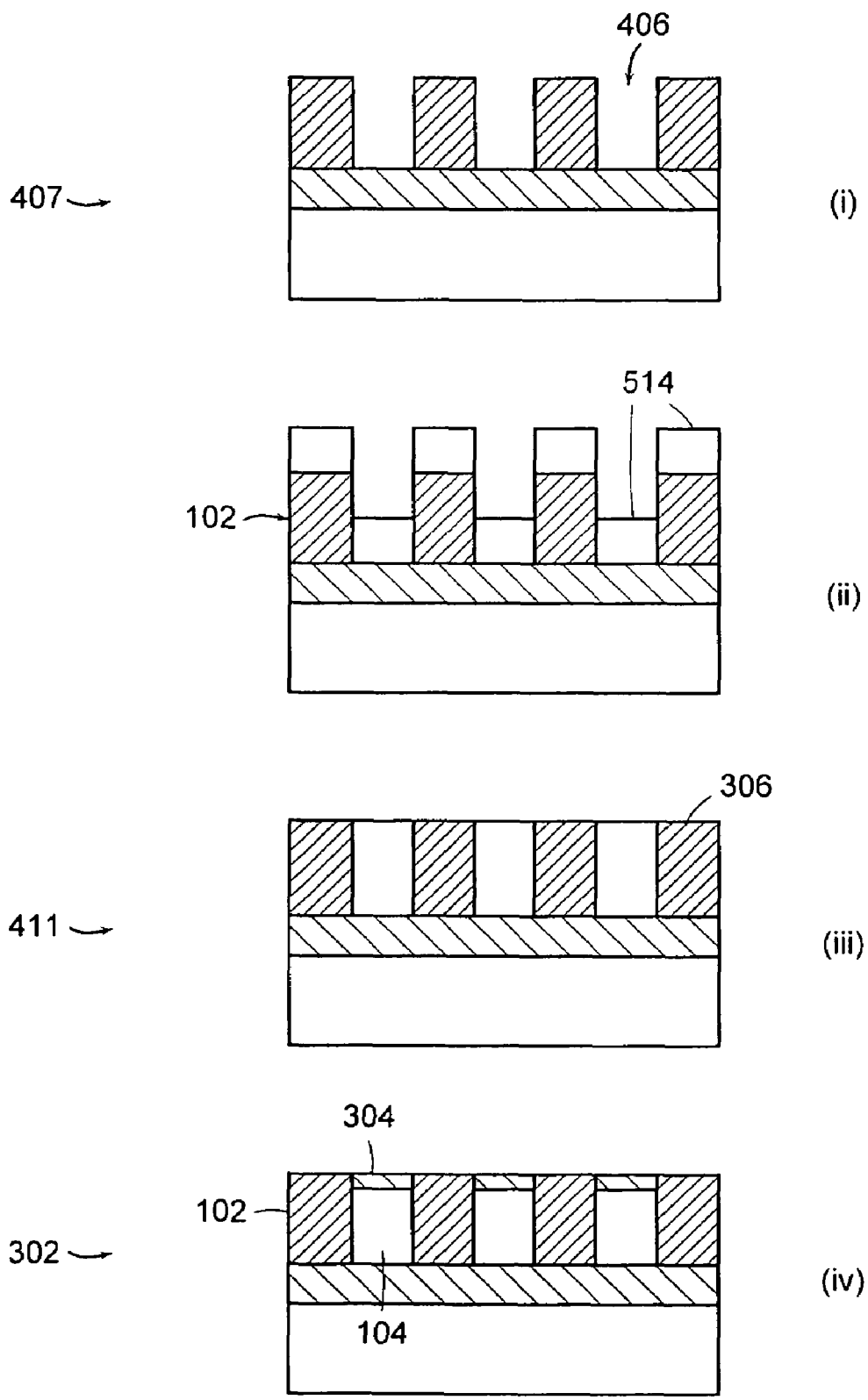

FIG. 5 shows another method that may be used to create the NTRCM devices 100 of certain embodiments. A support structure 407, like that described in connection with FIG. 4, is provided. A layer 514 of n-doped silicon is then added using a CVD process, sputtering or electroplating. Under certain embodiments, layer 514 is added to be about half the height of the $Si_3N_4$ supports 102.

After the layer 514 is added, an annealing step is performed to yield a planarized surface 306 to form a structure 411 like that described above. The annealing step causes the silicon of layer 514 to flow into the cavities 406.

Like that described in connection with FIG. 4, the structure 411 is then oxidized to form and define sacrificial layers 304 of $SiO_2$ about 10-20 nm deep into planar surface 306.

Figure 6:
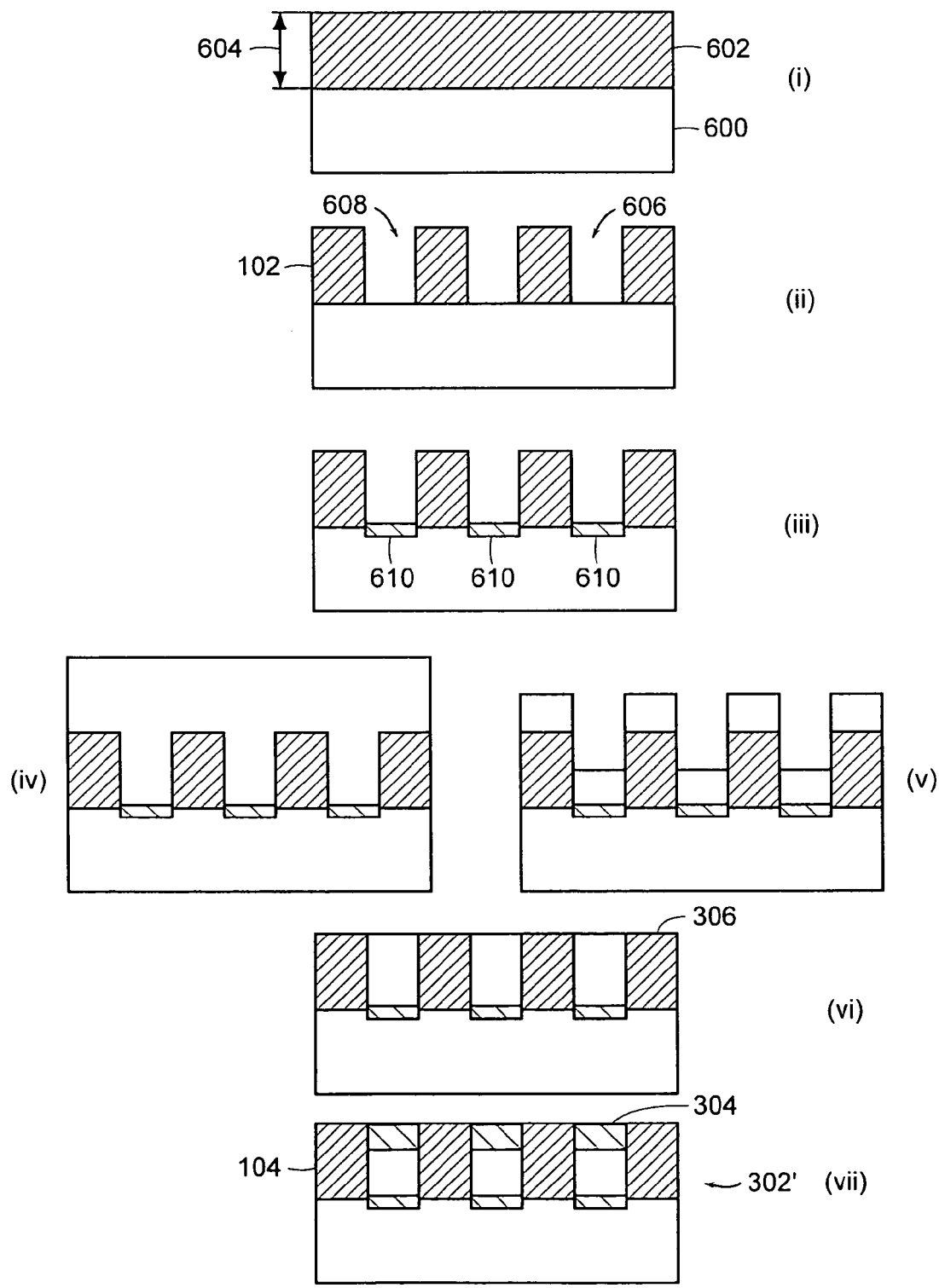

FIG. 6 shows another approach for forming an alternative first intermediate structure 302'. In this embodiment, a silicon substrate 600 is covered with a layer 602 of silicon nitride having a height 604 of at least 30 nm.

The silicon nitride layer 602 is then patterned and etched to generate spacings 606 and to defined supports 102. The etching process exposes a portion 608 of the surface of silicon substrate 600.

The exposed silicon surface 608 is oxidized to generate a silicon dioxide ($SiO_2$) layers 610 having a thickness of a few nm. These layers 610 eventually insulate trace 104 analogously to the way insulating layer 109 did for the above described structures 302.

Once the insulating layers 610 have been created, the traces 104 may be created in any of a variety of manner. FIG. 6 illustrates the processing steps of figures 4-5 used to create such traces to illustrate this point.

Figure 7:
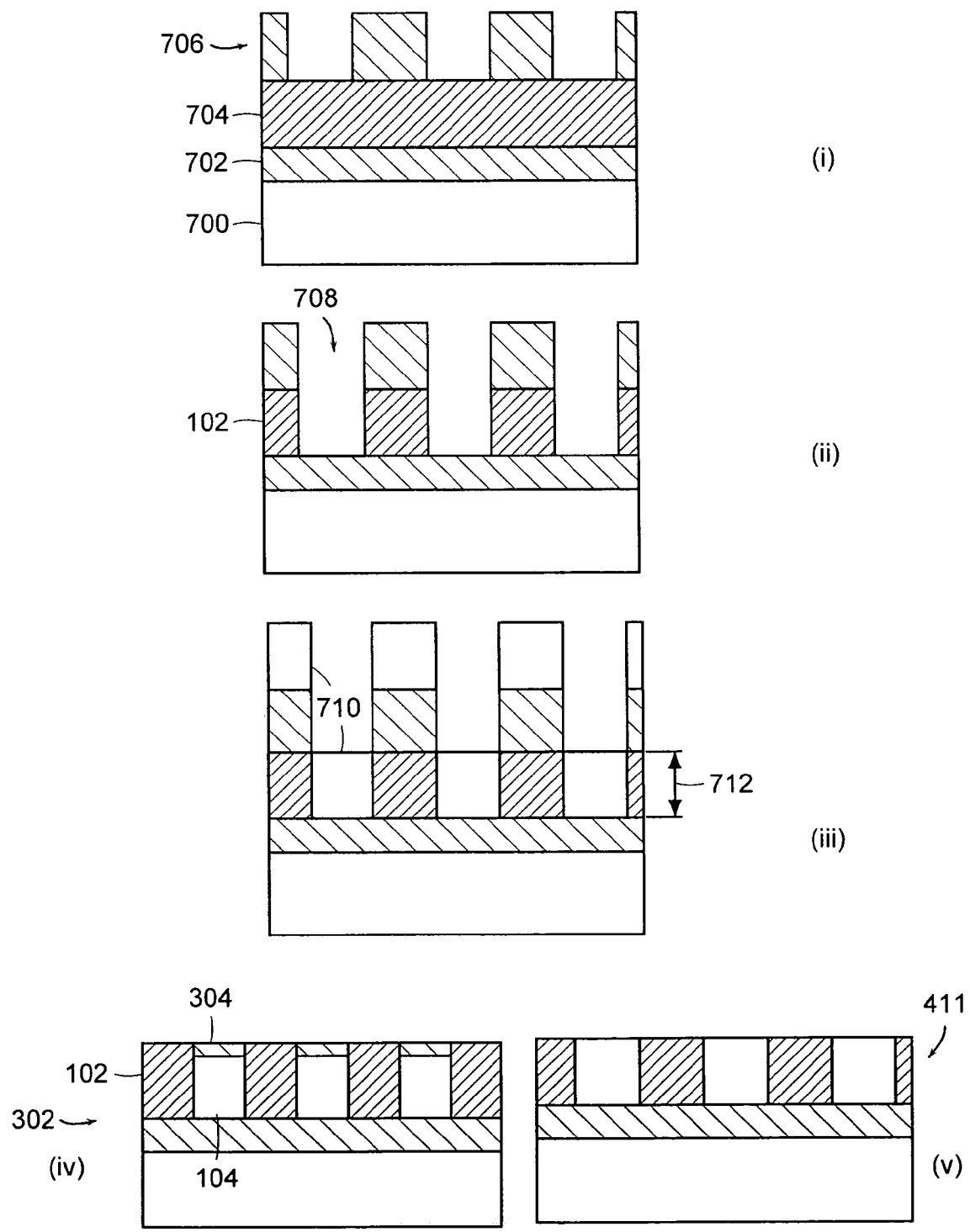

FIG. 7 shows another approach for forming first intermediate structure 302. A silicon substrate 700 having a silicon dioxide layer 702 and a silicon nitride layer 704 receives a patterned photoresist layer 706. For example, a photoresist layer may be spin-coated on layer 704 and subsequently exposed and lithographically developed.

Reactive ion etching (RIE) or the like may then be used to etch the $Si_3N_4$ layer 704 to form cavities 708 and to define supports 102.

Afterwards, n-doped silicon 710 may be deposited in the cavities 708. Under certain embodiments silicon is deposited to a height about equal to the height 712 of the $Si_3N_4$ supports 102.

The photoresist 706 and silicon 710 on top of the photoresist 706 are then striped away to form an intermediate structure 411 like that described above.

The structure 411 is then oxidized to generate the sacrificial $SiO_2$ layers 304.

Figure 8:
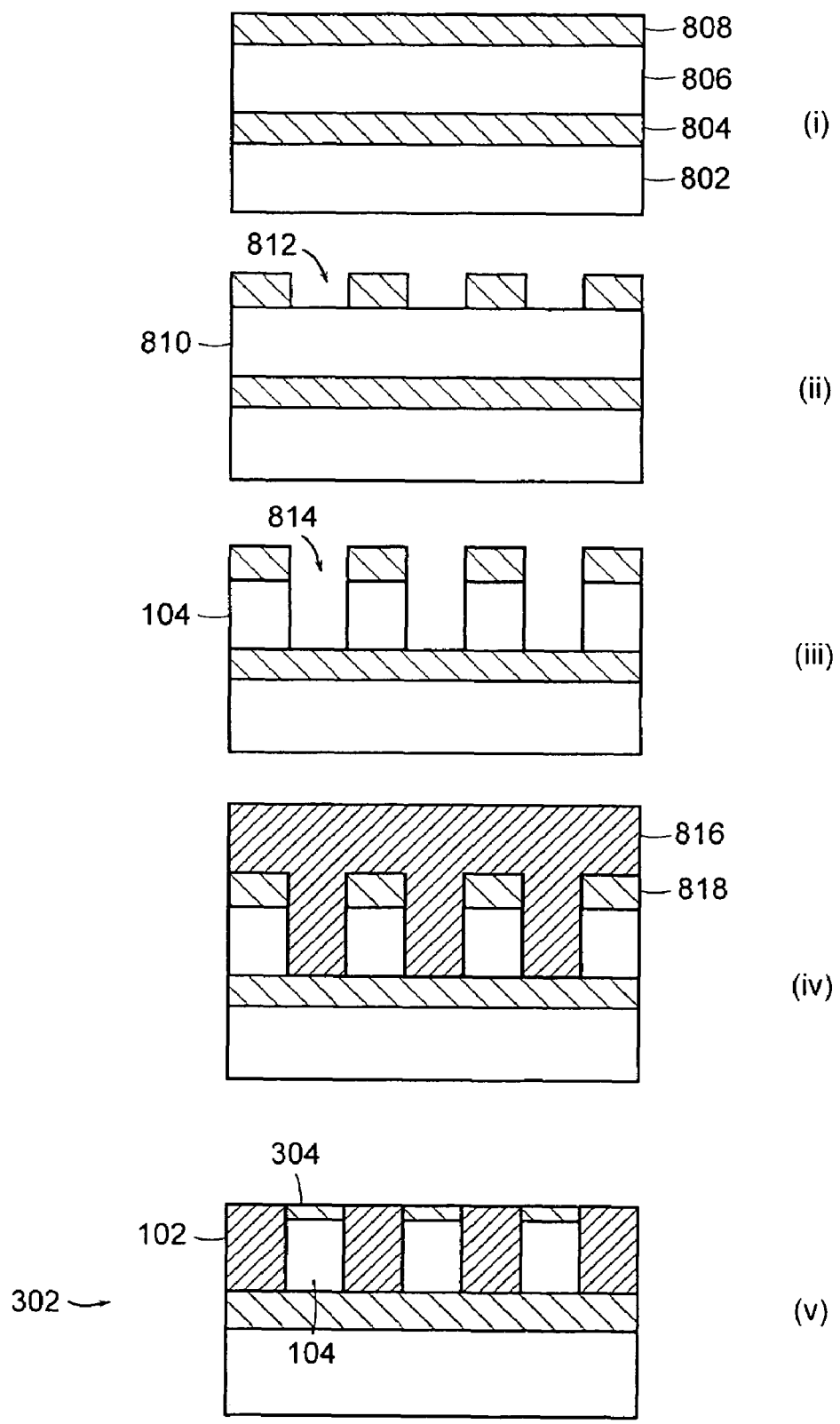

FIG. 8 shows another approach for forming first intermediate structure 302. Under this approach, a starting structure 800 is provided having a lowest silicon layer 802 with a lowest silicon dioxide layer 804 on top of it. A second silicon layer 806 is on top of layer 804 and a second silicon dioxide layer 808 is on top of the second silicon layer 806.

The top silicon dioxide ($SiO_2$) layer 808 is patterned by photolithography to create an RIE mask 810. The mask is used to etch the exposed portions 812 of second silicon layer 806 down to the first silicon dioxide layer 804. This etching creates cavities 814 and defines traces 104.

The cavities 814 are filled and covered with silicon nitride ($Si_3N_4$) 816.

The $Si_3N_4$ covering 816 is backetched with RIE to the same height 818 as the remaining portions of the $SiO_2$ layer 806 covering the n-doped silicon electrodes 104 (which form the sacrificial layer 304).

Figure 9:
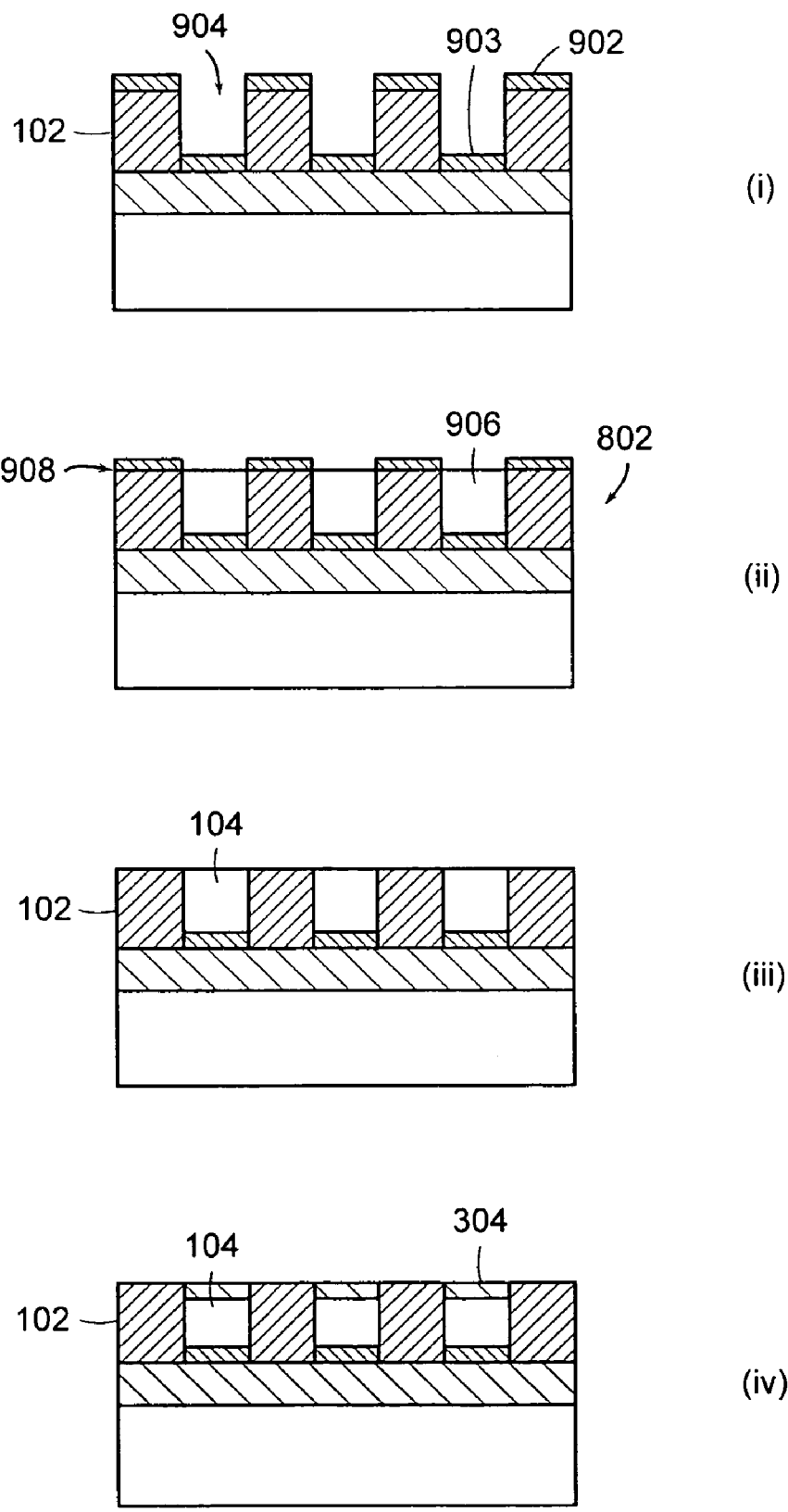

FIG. 9 shows an approach for forming an alternative first intermediate structure 302". Under this approach, a structure like 407 (shown in FIG. 4, but not FIG. 9) is provided. In this instance, the $Si_3N_4$ supports 102 have a height of about 30 nm. A thin layer of metal 902 is deposited on top of the $Si_3N_4$ supports 102 and on top of the exposed portions $SiO_2$ at the bottom of the cavities 904 as depicted by item 903. Metal 902 and 903 form temporary electrodes. A layer of n-doped silicon 906 may then be deposited or grown by electroplating, covering the electrode 903 until the silicon 906 achieves a height 908 at the top of the support 102 and contacting electrode 902. The growth process may be controlled by the onset of a current flow between the lower and upper metal electrodes 902,3.

The exposed metal electrodes 902 may then be removed by wet chemical methods or dry chemical methods. This forms an intermediate structure 411' like the structure 411 described above, but with a buried electrode 903, as an artifact of the silicon growing process.

The structure 411" is then oxidized to form sacrificial layers 304 at the exposed portions of silicon, as described above. For example, the layers 304 may be grown to a thickness of about 10 nm.

Figure 10:
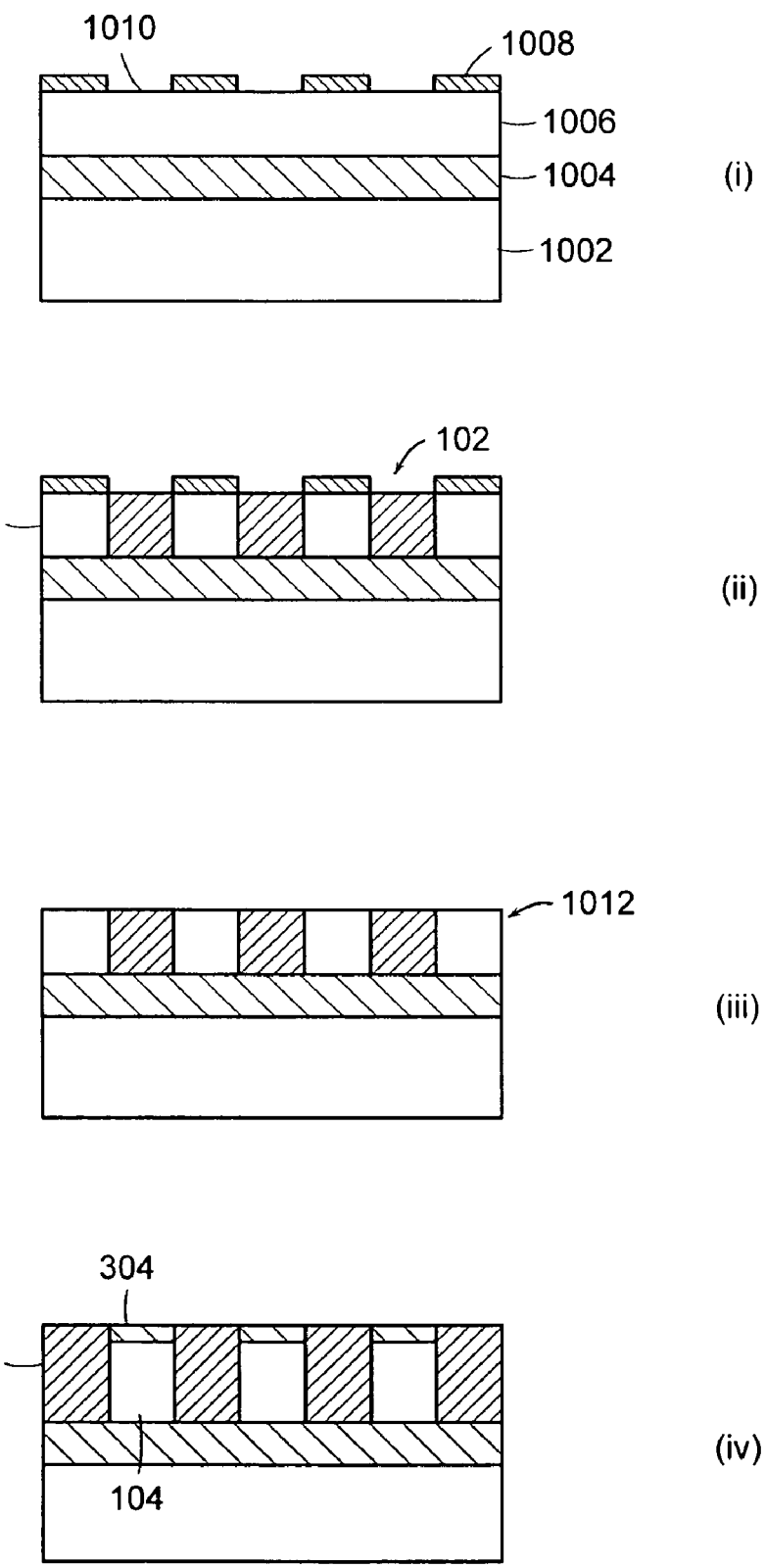

FIG. 10 shows another approach for forming first intermediate structure 302. A silicon substrate 1002 having a layer of silicon dioxide 1004 on top of it and a second layer 1006 of silicon (n-doped) on top of layer 1004 is used as a starting material. A mask layer 1008 is photolithographically patterned on top of layer 1006.

Using nitridization techniques, exposed portions 1010 of n-doped silicon layer 1006 are chemically converted to $Si_3N_4$ supports 102. The unconverted portions of layer 1006 form traces 104.

The mask 1008 is removed forming a structure 411 like that described above.

The exposed portions 1012 of silicon surface are then oxidized to form the $SiO_2$ sacrificial layers 304.

Figure 11:
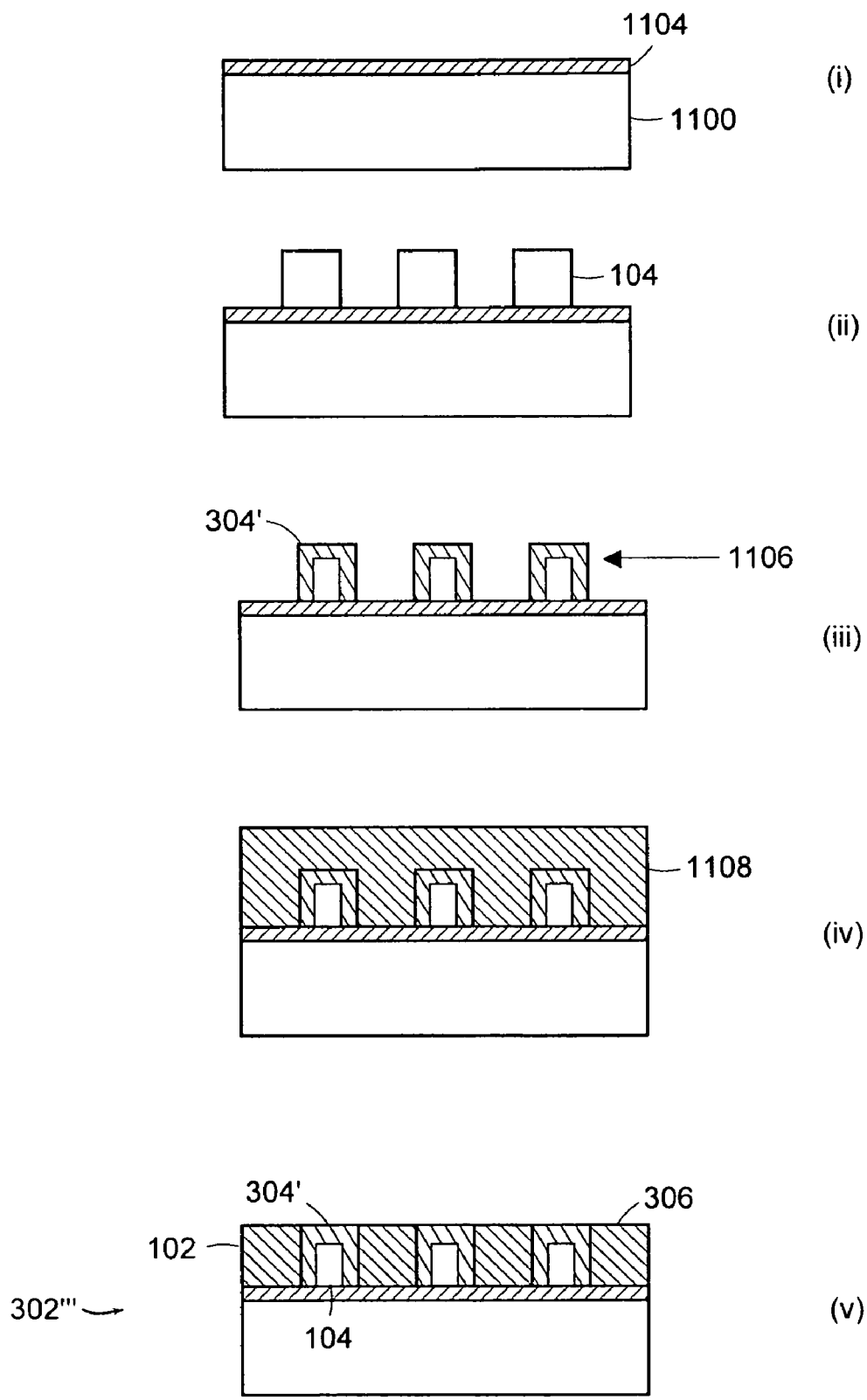

FIG. 11 shows an approach for forming an alternative first intermediate structure 302'" Under this approach a silicon substrate 1102 is layered with a thin film 1104 of $Si_3N_4$ as a starting structure. On top of the silicon nitride layer 1104, n-doped silicon is added and lithographically patterned, by RIE to form traces 104.

The surfaces of traces 104 are oxidized to form the $SiO_2$ layer 1106 which acts as an alternative form of sacrificial layer 304'.

The structure is overgrown with $Si_3N_4$ 1108 and back etched to form a planar surface 306 and to form alternative first intermediate structure 302'". As will be evident to those skilled in the art, under this approach, when the sacrificial layer is subsequently removed, traces 104 will be separated from supports 102. Other variations of this technique may be employed to create alternative transverse cross-sections of trace 104. For example, the traces 104 may be created to have a rounded top, or to have a triangular or trapezoidal cross section. In addition, the cross section may have other forms, such as a triangle with tapered sides.

As was explained above, once a first intermediate structure is formed, e.g., 302, a matted nanotube layer 312 is provided over the planar surface 306 of the structure 302. In preferred embodiments, the non-woven fabric layer 312 is grown over the structure through the use of a catalyst 308 and through the control of a growth environment. Other embodiments may provide the matted nanotube layer 312 separately and apply it directly over the structure 302. Though structure 302 under this approach preferably includes the sacrificial layer to provide a planar surface to receive the independently grown fabric, the sacrificial layer may not be necessary under such an approach.

Figure 12:
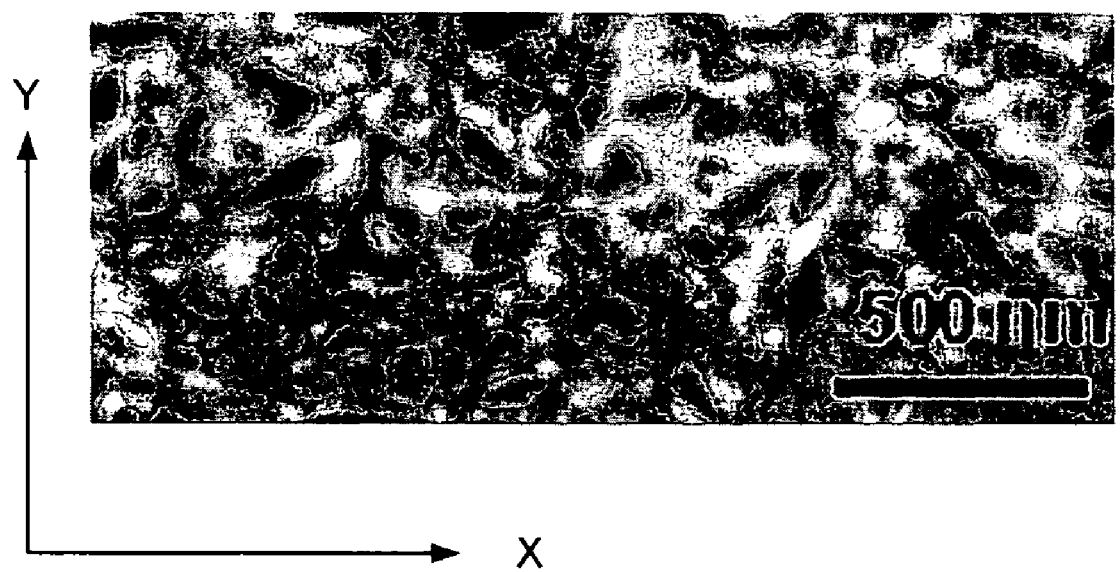
FIG. 12 illustrates the non-woven nanotube fabric, or matted nanotube layer, used to make certain embodiments of the invention.

Because the growth process causes the underside of such nanotubes to be in contact with planar surface 306 of intermediate structure 302, they exhibit a "self-assembly" trait as is suggested by FIG. 12. In particular, individual nanotubes tend to adhere to the surface on which they are grown whenever energetically favorable, such that they form substantially as a "monolayer." Some nanotubes may grow over another so the monolayer is not expected to be perfect. The individual nanotubes do not "weave" with one another but do adhere with one another as a consequence of Van der Waals forces. FIG. 12 is an approximate depiction of an actual nanotube non-woven fabric. Because of the small feature sizes of nanotube, even modern scanning electron microscopy cannot "photograph" an actual fabric without loss of precision; nanotubes have feature sizes as small as 1-2 nm which is below the precision of SEM. FIG. 12 for example, suggests the fabric's matted nature; not clear from the figure, however, is that the fabric may have small areas of discontinuity with no tubes present. Each tube typically has a diameter 1-2 nm (thus defining a fabric layer about 1-2 nm) but may have lengths of a few microns but may be as long as 200 microns. The tubes may curve and occasionally cross one another. Tubes attach to one another via Van der Waals forces.

In certain embodiments, nanotubes grow substantially unrestrained in the x- and y-axis directions, but are substantially restricted in the z-axis (perpendicular to page of FIG. 12) as a consequence of the self-assembly trait. Other embodiments may supplement the above approach to growing matte 312 with the use of field-oriented or flow-oriented growth techniques. Such supplementation may be used to further tailor growth such that any growth in one planar axis (e.g. the—x-axis) is retarded. This allows for a more even coverage of the desired area with a planar interwoven monolayer coating of nanotubes with a controllable density.

Figure 13:
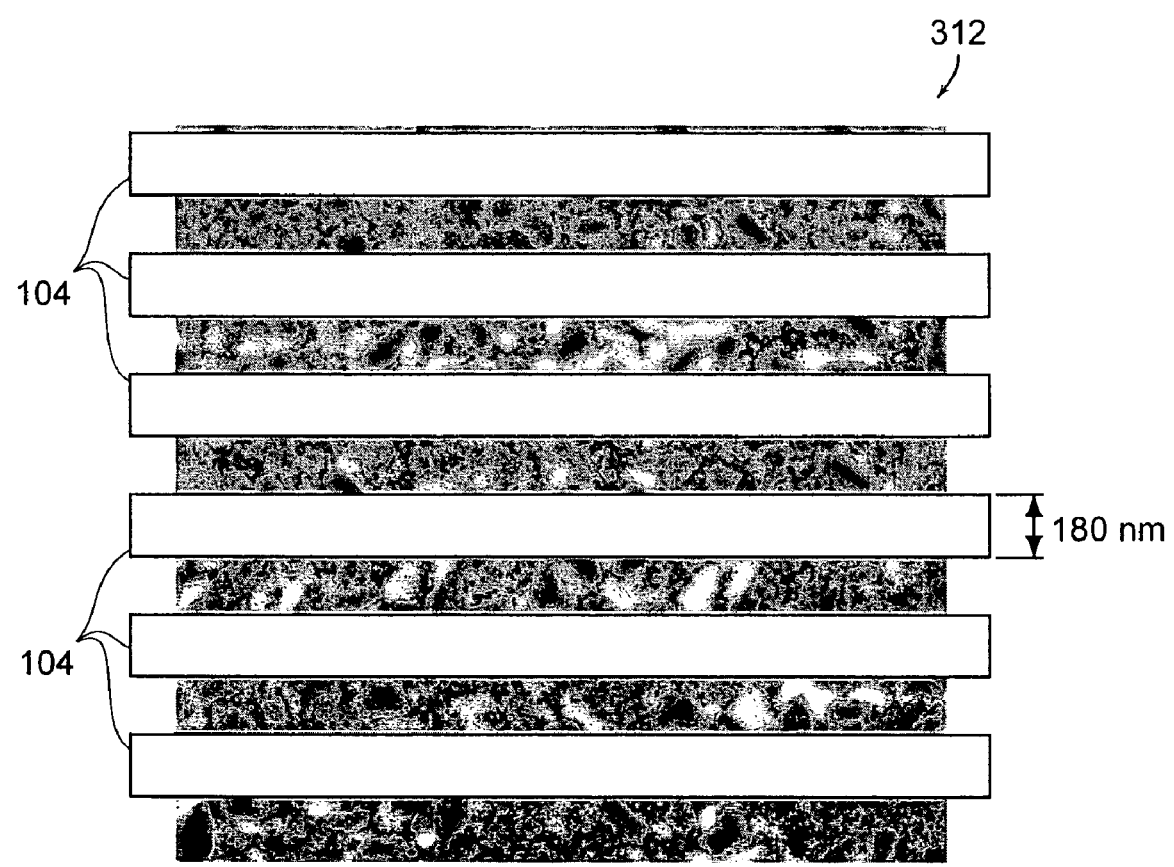
FIG. 13 illustrates the matted nanotube layer in relation to hidden, underlying traces of certain embodiments of the invention.

A plan view of the matted nanotube layer 312 with underlying silicon traces 104 is shown in FIG. 13.

As explained above, once the matted nanotube layer 312 is provided over the surface 306, the layer 312 is patterned and etched to define ribbons 101 of nanotube fabric that cross the supports 102. The sacrificial layer is then removed (e.g., with acid) forming the array 322 described above in connection with FIG. 3. Because the matted layer of nanotubes 312 form a non-woven fabric that is not a contiguous film, etchants or other chemicals may diffuse between the individual nanotube "fibers" and more easily reach the underlying components, such as the sacrificial layer.

Subsequent metalization may be used to form addressing electrodes, e.g., 112 shown in FIG. 1, as outlined above. Other embodiments use nanotube technology to implement addressing of memory cells instead of using metallized electrodes 112 and addressing lines (not shown).

More specifically, under certain embodiments described above, nanotubes are used to form NTRCM arrays. Certain embodiments use nanotube technology, whether in individual wire or belt form, to implement addressing logic to select the memory cell(s) for reading or writing operations. This approach furthers the integration of nanotube technology into system design and may provide beneficial functionality to higher-level system design. For example, under this approach the memory architecture will not only store memory contents in non-volatile manner but will inherently store the last memory address.

The nanotube-based memory cells have bistability characterized by a high ratio of resistance between "0" and "1" states. Switching between these states is accomplished by the application of specific voltages across the nanotube belt or wire and the underlying trace, in which at least one of the memory cell elements is a nanotube or a nanotube ribbon. In one approach, a "readout current" is applied and the voltage across this junction is determined with a "sense amplifier." Reads are non-destructive, meaning that the cell retains its state, and no write-back operations are needed as is done with DRAM.

Figure 14:
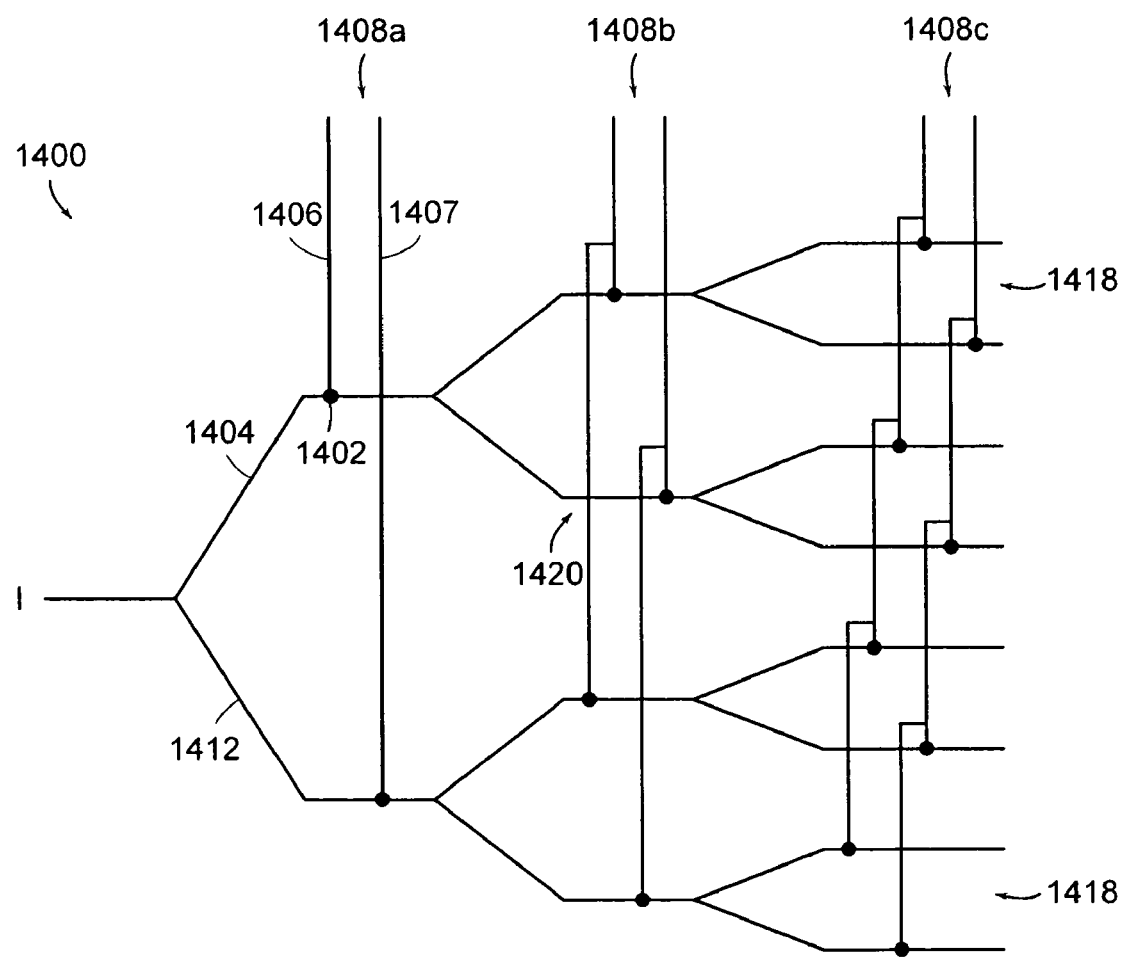
FIG. 14 illustrates addressing logic of certain embodiments of the invention.

FIG. 14 depicts a branching binary select system, or decoder, 1400. As will be explained below, decoder 1400 may be implemented with nanotubes or nanotube ribbon technology. Moreover, the decoder may be constructed on the same circuit component as a nanotube memory cell array, e.g., NTRCM or NTWCM.

A perpendicular intersection of two lines 1404 and 1406 depicted as a dot 1402 indicates a junction of two nanotubes or nanotube ribbons. In this regard, the interaction is analogous to a "pass transistor" found in CMOS and other technology, in which the intersection may be opened or closed.

Locations such as 1420 where one nanotube or nanotube ribbon may cross another but which are not intended to create a crossbar junction may be insulated from one another with a lithographically patterned insulator between the components.

For the sake of clarity, the decoder illustrated is for a 3-bit binary address carried on addressing lines 1408. Depending on the value of the encoding the intersections (dots) will be switched to create only one path through which sensing current I may pass to select lines 1418.

To use this technique, a "dual rail" representation 1408 of each bit of the binary address is fashioned externally so that each of the address bits 1410 is presented in true and complementary form. Thus, line 1406 may be the logical true version of address line 1408*a* and line 1407 may be the logical complement of address line 1408*a*. The voltage values of the representation 1408 are consistent with that needed to switch a crossbar junction to the "1" or "0" state as described above.

In this fashion an address 1408 may be used to supply a sense current I to a bit or row of bits in an array, e.g., to nanotubes or nanotube ribbons. Likewise, the same approach may be used to sense a given trace, for example, selecting specific array column(s) to read sense from in conjunction with selecting a row. Thus this approach may be used for X and/or Y decoding both for reading and for writing operations.

Figure 15:
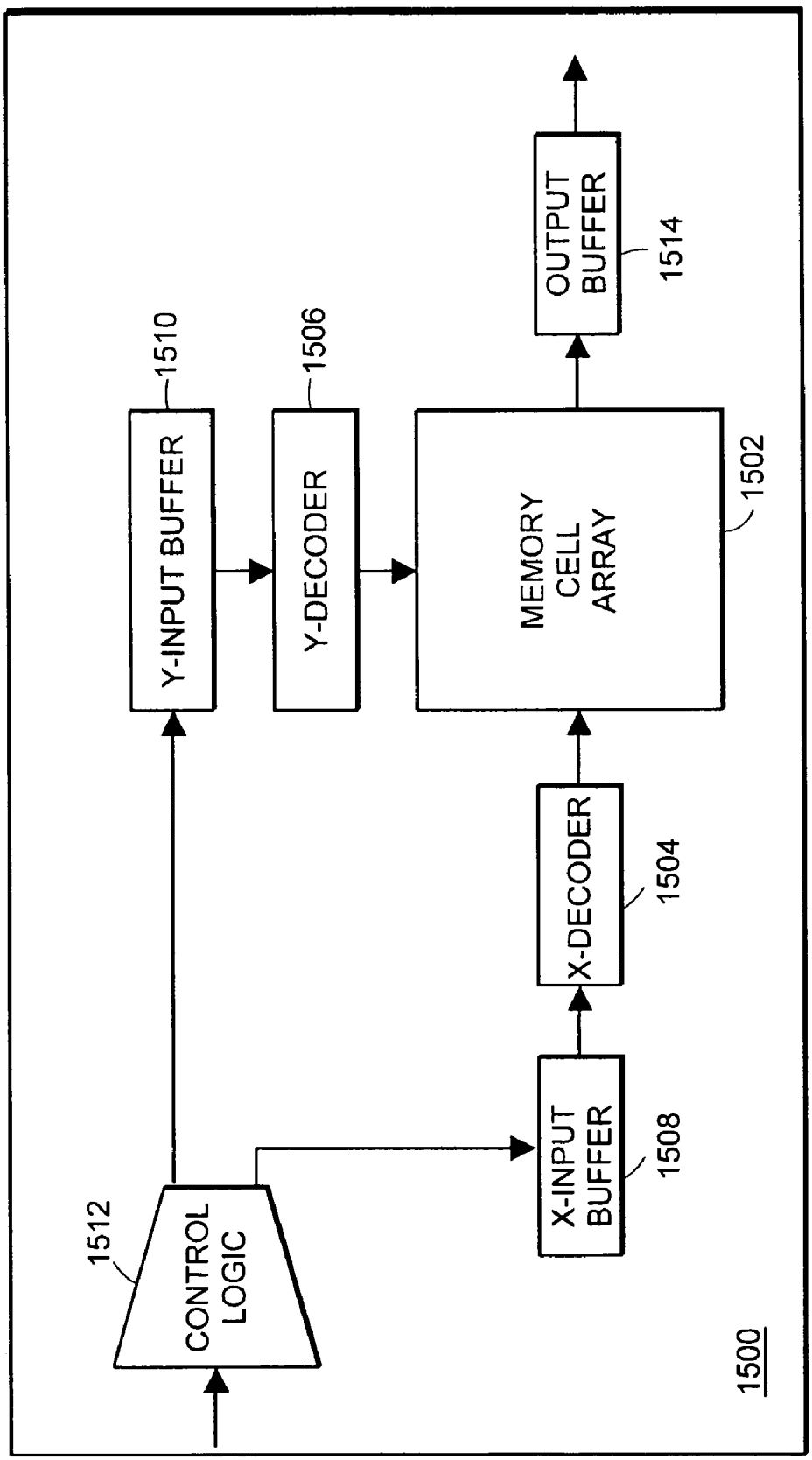
FIG. 15 illustrates a hybrid technology embodiment of the invention in which the memory core uses nanotube technology.

Certain embodiments of the invention provide a hybrid technology circuit 1500, shown in FIG. 15. A core memory cell array 1502 is constructed using NTWCM or NTRCM, and that core is surrounded by semiconductor circuits forming X and Y address decoders 1504 and 1506; X and Y buffers 1508 and 1510; control logic 1512 and output buffers 1514. The circuitry surrounding the NTWCM or NWBCM core may be used for conventional interfacing functions, including providing read currents and sensing output voltages.

In other embodiments, the X and Y address decoders 1504 and 1506 may be substituted with the nanotube wire or belt addressing technique discussed above. In these embodiments the core would include memory cells and addressing logic.

In certain embodiments, the hybrid circuit 1500 may be formed by using a nanotube core (having either just memory cells or memory cells and addressing logic) and by implementing the surrounding circuitry using a field programmable gate array. The core and gate array circuitry may be contained in a single physical package if desired. Or, they may be packaged separately. For example, a hermitically packaged nanotube circuit (having memory or memory and addressing logic) may be combined with a PLD/FPGA/ ASIC in which the I/O interfacing logic is contained. The resulting compact chipset provides access to the benefits of the NT memory for the user of the product, while maximizing the use of "off-the-shelf" technologies, which may be utilized on an as-needed basis by the manufacturer.

Figure 16:
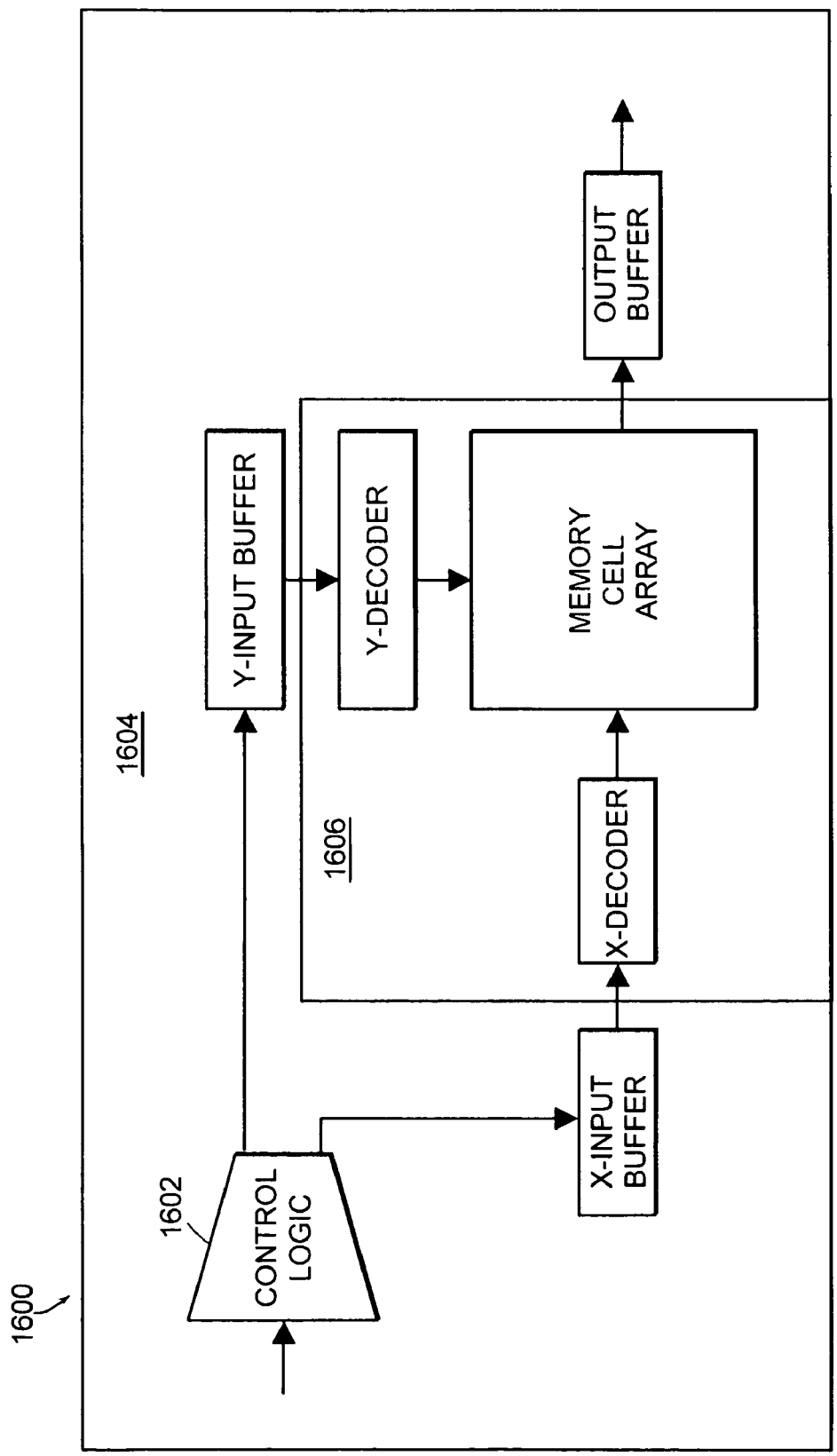
FIG. 16 illustrates a hybrid technology embodiment of the invention in which the memory core and addressing lines use nanotube ribbon technology.

FIG. 16 depicts one possible implementation 1600 of the hybrid technology. A FPGA chip 1602 containing the buffering and control logic (described above) is connected via conducting traces on a (perhaps multilayer) printed circuit board (PCB) 1604 to a nanotube (NT) chip 1606 containing the memory cells and addressing logic.

This particular embodiment is suggested to conform to the PCI bus standard, typical of today's personal computers. Other passive circuitry, such as capacitors, resistors, transformers, etc. (not pictured) would also be necessary to conform to the PCI standard. A front-side bus speed of 200 MHz-400 MHz is annotated, suggesting the kinds of external clock speeds such a chipset might run at. This speed is limited by the PCB interconnects and FPGA/PLD/ASIC speed, and also the chip packages, not the NT memory cell speed.

OTHER EMBODIMENTS

Besides carbon nanotubes other materials with electronic and mechanical properties suitable for electromechanical switching could be envisioned. These materials would have properties similar to carbon nanotubes but with different and likely reduced tensile strength. The tensile strain and adhesion energies of the material must fall within a range to allow bistability of the junction and electromechanical switching properties to exist within acceptable tolerances.

For the purpose of integrating CMOS logic for addressing two approaches can be envisioned. In the first embodiment the nanotube array will be integrated before metallization but after ion implantation and planarization of the CMOS logic devices. A second method involves growth of the nanotube arrays before fabrication of the CMOS devices involving ion implementation and high temperature annealing steps. Upon completion of these steps the final metallization of both the nanotube ribbons and the CMOS devices will proceed using standard and widely used protocols.

Electrodes consisting of n-doped silicon on top of some metal or semiconductor line can also be envisioned. This will still provide rectifying junctions in the ON state so that no multiple current pathways exist.

In addition to rectifying junctions, there are other widely accepted and used methods to prevent the occurrence of electrical crosstalk (i.e. multiple current pathways) in crossbar arrays. Tunnel barriers on top of the static, lithographically fabricated electrodes prevent the formation of ohmic ON states. No leakage currents at zero bias voltage will occur but a small bias voltage has to be applied for the charge carriers to overcome this barrier and tunnel between the crossing lines.

Methods to increase the adhesion energies through the use of ionic, covalent or other forces can be envisioned to alter the interactions with the electrode surfaces. These methods can be used to extend the range of bistability with these junctions.

Nanotubes can be functionalized with planar conjugated hydrocarbons such as pyrenes which may then aid in enhancing the internal adhesion between nanotubes within the ribbons.

Certain of the above aspects, such as the hybrid circuits and the nanotube technology for addressing, are applicable to individual nanotubes (e.g., using directed growth techniques, etc.) or to nanotube ribbons.

It will be further appreciated that the scope of the present invention is not limited to the above-described embodiments but rather is defined by the appended claims, and that these claims will encompass modifications of and improvements to what has been described.

What is claimed is:

1. An addressing element in a circuit, the addressing element comprising:
a switching element;
control logic to control the switching element; and
a nanotube ribbon comprising a non-woven fabric of nanotubes and configured to provide an electrical communication path between the control logic and the switching element.

2. The addressing element of claim 1, wherein the nanotubes of the nanotube ribbon provide a plurality of conductive pathways between the control logic and the switching element.

3. The addressing element of claim 1, wherein the switching element comprises at least one nanotube.

4. The addressing element of claim 3, wherein the switching element comprises a non-woven fabric of nanotubes.

5. The addressing element of claim 1, wherein a section of the nanotube ribbon comprises a portion of the switching element.

6. The addressing element of claim 1, wherein the switching element is electromechanically operable in response to electrical stimulus by the control logic.

7. The addressing element of claim 1, wherein the switching element comprises a memory cell.

8. The addressing element of claim 1, wherein the switching element is non-volatile.

9. The addressing element of claim 1, wherein the control logic comprises a decoder circuit.

10. The addressing element of claim 1, wherein the control logic comprises at least one nanotube.

11. The addressing element of claim 1, wherein the control logic is non-volatile.

12. The addressing element of claim 1, wherein a section of the nanotube ribbon comprises at least a portion of the control logic.

13. An addressing trace to carry an electrical signal, the trace comprising a nanotube ribbon.

14. The trace of claim 13, wherein the ribbon comprises a non-woven fabric of nanotubes.

15. The trace of claim 14, wherein the ribbon comprises a matted layer of nanotubes.

16. The trace of claim 14, wherein the ribbon comprises a layer of entangled nanotubes, the layer being substantially planar.

17. The trace of claim 13, wherein the ribbon comprises a plurality of nanotubes having an orientation that is substantially unconstrained in a plane and highly constrained in a direction normal to that plane.

18. The trace of claim 13, wherein the nanotube ribbon provides redundant conductive pathways along the trace.

19. The trace of claim 13, wherein the nanotube ribbon is a non-contiguous film.

* * * * *